United States Patent
Chang et al.

(10) Patent No.: US 12,176,385 B2
(45) Date of Patent: Dec. 24, 2024

(54) SEMICONDUCTOR DEVICE FOR ENHANCING QUALITY FACTOR OF INDUCTOR AND METHOD OF FORMING THE SAME

(71) Applicant: RichWave Technology Corp., Taipei (TW)

(72) Inventors: Chia-Wei Chang, Taipei (TW); Yan-Han Huang, Taipei (TW); Chin-Chia Chang, Taipei (TW)

(73) Assignee: RichWave Technology Corp., Taipei (TW)

( * ) Notice: Subject to any disclaimer, the term of this patent is extended or adjusted under 35 U.S.C. 154(b) by 124 days.

(21) Appl. No.: 17/990,733

(22) Filed: Nov. 20, 2022

(65) Prior Publication Data

US 2024/0113154 A1    Apr. 4, 2024

(30) Foreign Application Priority Data

Sep. 29, 2022  (TW) .................................. 111137093

(51) Int. Cl.
*H01L 23/64*  (2006.01)
*H01L 27/08*  (2006.01)
*H01L 49/02*  (2006.01)

(52) U.S. Cl.
CPC ............ *H01L 28/10* (2013.01); *H01L 23/645* (2013.01)

(58) Field of Classification Search
CPC .............................. H01L 28/10; H01L 23/645
See application file for complete search history.

(56) References Cited

U.S. PATENT DOCUMENTS 5,095,357 A    3/1992 Andoh
2004/0212034 A1  10/2004 Mochizuki
(Continued)

FOREIGN PATENT DOCUMENTS

CN    1515026 A    7/2004
CN  103985698 A    8/2014
(Continued)

OTHER PUBLICATIONS

Office action mailed on Sep. 23, 2023 for the Taiwan application No. 111137093, filing date Sep. 29, 2022, p. 1-4. ,Sep. 23, 2023.
(Continued)

*Primary Examiner* — Herve-Louis Y Assouman
(74) *Attorney, Agent, or Firm* — Winston Hsu

(57) ABSTRACT

A semiconductor device may include a compound substrate and a 3-dimensional inductor structure. The compound substrate may include a front surface and a back surface. The 3-dimensional inductor structure may include a front conductive stack, a back conductive layer, and at least one through-hole structure. At least one portion of the front conductive stack may include a first conductive layer disposed on the front surface of the compound substrate, and a second conductive layer disposed on the first conductive layer. The second conductive layer has a thickness ranging between 30 micrometers and 400 micrometers. The back conductive layer is disposed on the back surface of the compound substrate. The at least one through-hole structure penetrates through the compound substrate, and electrically connects the front conductive stack to the back conductive layer.

20 Claims, 8 Drawing Sheets

(56) References Cited

U.S. PATENT DOCUMENTS

| | | | |
|---|---|---|---|
| 2004/0217440 A1 | 11/2004 | Ng | |
| 2010/0210299 A1 | 8/2010 | Gorbachov | |
| 2013/0005109 A1 | 1/2013 | Dao | |
| 2014/0209926 A1 | 7/2014 | Takatani | |
| 2014/0247269 A1* | 9/2014 | Berdy | H01L 23/498 336/200 |
| 2015/0035162 A1 | 2/2015 | Lan | |
| 2016/0020013 A1 | 1/2016 | Berdy | |
| 2017/0330940 A1 | 11/2017 | Lee | |
| 2020/0304089 A1 | 9/2020 | Joshi | |
| 2021/0099149 A1 | 4/2021 | Lan | |
| 2022/0014176 A1* | 1/2022 | Lan | H03H 1/00 |
| 2023/0006029 A1* | 1/2023 | Chang | H01L 23/481 |

FOREIGN PATENT DOCUMENTS

| | | |
|---|---|---|
| CN | 109889168 A | 6/2019 |
| TW | 200824094 | 6/2008 |
| TW | 201023299 A1 | 6/2010 |
| TW | 201108387 A1 | 3/2011 |
| TW | 201135803 A1 | 10/2011 |
| TW | 201222762 A1 | 6/2012 |
| TW | 201351457 A | 12/2013 |
| TW | 201428433 A | 7/2014 |
| TW | 201528501 A | 7/2015 |
| TW | 201543559 A | 11/2015 |
| TW | 201543641 A | 11/2015 |
| TW | 201642370 A | 12/2016 |
| TW | 201707199 A | 2/2017 |
| TW | M557453 U | 3/2018 |
| TW | 201901916 | 1/2019 |
| TW | 202109822 A | 3/2021 |
| WO | 2022/010576 A1 | 1/2022 |

OTHER PUBLICATIONS

Office action mailed/issued on Nov. 6, 2023 for TW application No. 110124062, filing date: Jun. 30, 2021, pp. 1~17. ,Nov. 6, 2023.

Office action mailed on Jan. 16, 2024 for the U.S. Appl. No. 17/408,485, filed Aug. 23, 2021, p. 1-34 ,Jan. 16, 2024.

Chang, the specification, including the claims, and drawings in the U.S. Appl. No. 17/408,485, filed Aug. 23, 2021.

Office action mailed on Jul. 4, 2023 for the Taiwan application No. 110124062, filing date Jun. 30, 2021, p. 1-21., Jul. 4, 2023.

Office action mailed on Sep. 14, 2023 for the U.S. Appl. No. 17/408,485, filed Aug. 23, 2021, p. 1-24, 2023.

* cited by examiner

SEMICONDUCTOR DEVICE FOR ENHANCING QUALITY FACTOR OF INDUCTOR AND METHOD OF FORMING THE SAME

TECHNICAL FIELD

The present invention relates to semiconductors, and in particular, to a semiconductor device and a method of forming the semiconductor device.

BACKGROUND

Group III-V semiconductors and Group II-VI semiconductors may have excellent characteristics such as a high operating speed and a high power output, and may be suitable for fabricating communication devices. In radio frequency circuits of the communication devices, integrated passive devices (IPDs) such as inductors can find many uses, such as in a matching network or an LC resonator. However, in the related art, an inductor may usually occupy a large area, which is unfavorable for size reduction of the communication device, and may thus increase the manufacturing cost.

SUMMARY

According to an embodiment of the invention, a semiconductor device may include a substrate and a three-dimensional inductor structure. The substrate may include a front surface and a back surface. The three-dimensional inductor structure may include a front conductive stack, a bottom conductive layer and at least one through-hole structure. At least a portion of the front conductive stack may include a first conductive layer disposed on the front surface of the substrate and a second conductive layer disposed on the first conductive layer, and a thickness of the second conductive layer may range from 30 micrometers to 400 micrometers. The back conductive layer is disposed on the back surface of the substrate. The at least one through-hole structure penetrates the substrate and electrically connects the front conductive stack and the back conductive layer.

According to another embodiment of the invention, a semiconductor device may include a substrate and a three-dimensional inductor structure. The substrate may include a front surface and a back surface. The three-dimensional inductor structure may include a front conductive stack, a back conductive layer and at least one through-hole structure. At least a portion of the front conductive stack may include a first conductive layer disposed on the front surface of the substrate and a second conductive layer disposed on the first conductive layer, and a ratio of a thickness of the second conductive layer to a thickness of the first conductive layer may range from 6 to 80. The back conductive layer is disposed on the back surface of the substrate. The at least one through-hole structure penetrates the substrate and electrically connects the front conductive stack and the back conductive layer.

According to yet another embodiment of the invention, a method of forming a semiconductor device may include: forming a first conductive layer on a front surface of a substrate; forming a second conductive layer on the first conductive layer, a thickness of the second conductive layer ranging from 30 micrometers to 400 micrometers, or a ratio of the thickness of the second conductive layer to a thickness of the first conductive layer ranging from 6 to 80. The method further may include: thinning the substrate from a back surface of the substrate; drilling from the back surface of the substrate to form at least one through-hole; forming at least one through-hole structure in the at least one through-hole, the at least one through-hole structure being electrically connected to the front conductive layer; and forming a back conductive layer on the back surface of the substrate, the at least one through-hole structure being electrically connected to the back conductive layer.

DETAILED DESCRIPTION

Figure 1:
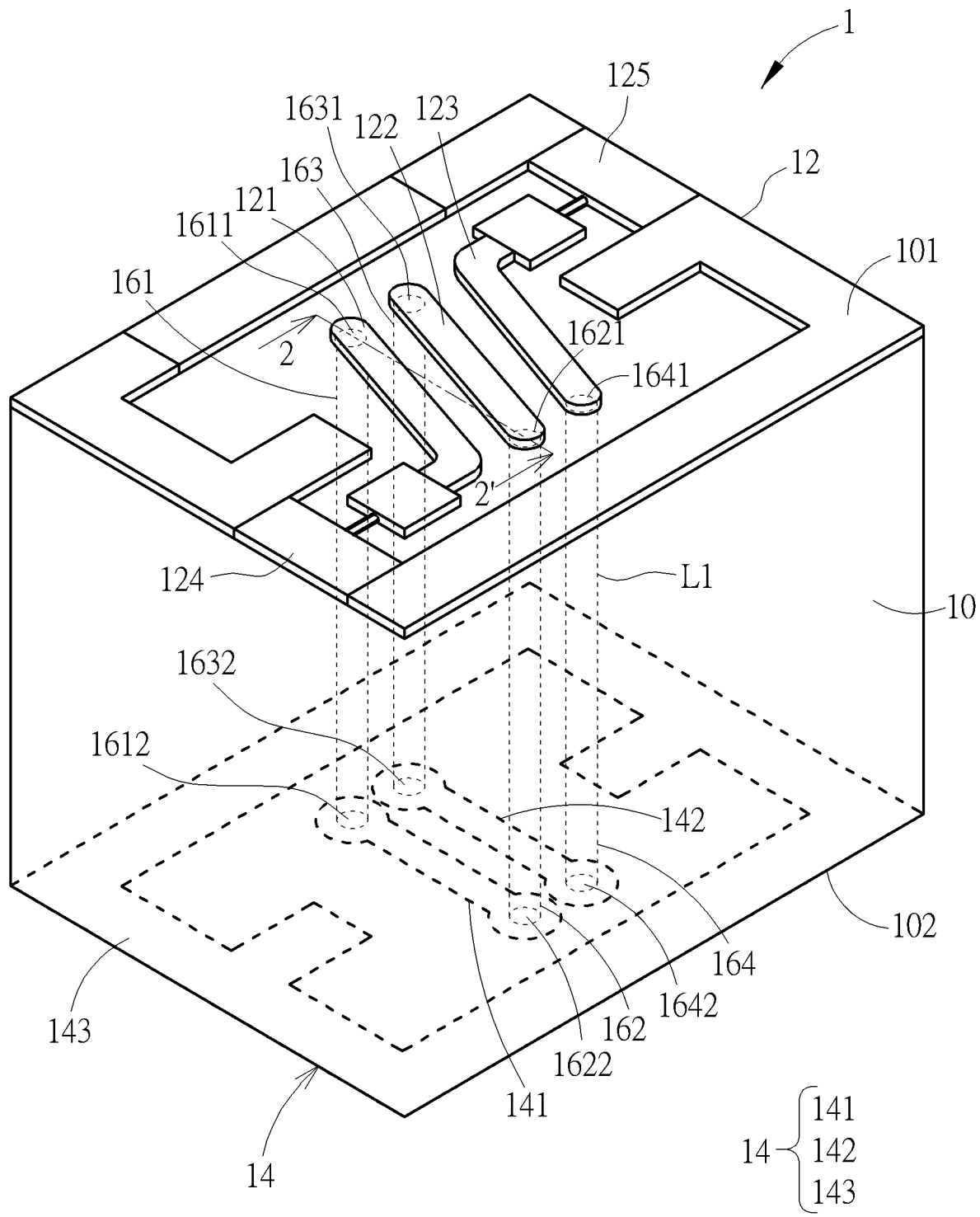
FIG. 1 is a schematic diagram of a semiconductor device according to an embodiment of the invention.

Below, exemplary embodiments will be described in detail with reference to accompanying drawings so as to be easily realized by a person having ordinary knowledge in the art. The inventive concept may be embodied in various forms without being limited to the embodiments set forth herein. Descriptions of well-known parts are omitted for clarity, and like reference numerals refer to like elements throughout.

FIG. 1 is a schematic diagram of a semiconductor device 1 according to an embodiment of the invention. The semiconductor device 1 may include a silicon semiconductor device, a Group III and V semiconductor device and a Group II and VI semiconductor device. The semiconductor device 1 may include an integrated passive device (IPD). The integrated passive device may include an inductor. In some embodiments, the integrated passive device may include an inductor, a capacitor, a resistor, other components, or a combination thereof. As for the semiconductor device 1, various front structures, through-hole structures and back structures on/in a substrate may be utilized to form various integrated passive devices with smaller circuit area and enhanced circuit performance.

In FIG. 1, the semiconductor device 1 may include a substrate 10 and a three-dimensional inductor structure L1. The three-dimensional inductor structure L1 may include a front conductive stack 12, a back conductive layer 14 and at least one through-hole structure. The substrate 10 may include a front surface 101 and a back surface 102. The front conductive stack 12 is disposed on the front surface 101 of the substrate 10, and the back conductive layer 14 is disposed on the back surface 102 of the substrate 10. At least one through-hole structure may include through-hole structures 161 to 164 penetrating from/to the front surface 101 to/from the back surface 102 of the substrate 10, and electrically connecting the front conductive stack 12 to the back conductive layer 14. For example, the three-dimensional inductor structure L1 may be fabricated using an integrated passive device (TPD) process, a heterojunction bipolar transistor (HBT) process, or a high electron mobility transistor (HEMT) process.

In some embodiments, the compound substrate 10 may include a Group III and V semiconductor substrate and a Group II and VI semiconductor substrate. For example, the compound substrate 10 may include a gallium arsenic (GaAs) semiconductor substrate, gallium nitride (GaN) semiconductor substrate and gallium phosphide (GaP) semiconductor substrate. In some embodiments, the substrate 10 may comprise a silicon substrate.

In some embodiments, at least a portion of front conductive stack 12 may include front conductive paths 121 to 123 (also referred to as the first conductive path 122, the second conductive path 121, and the third conductive path 123). At least a portion of back conductive layer 14 may include back conductive paths 141 and 142 (also referred to as the first back conductive path 141 and the second back conductive path 142). The through-hole structures 161 to 164 (also referred to as the first through-hole structure 163, the second through-hole structure 162, the third through-hole structure 161, and the fourth through-hole structure 164) may possess inductive properties, and the through-hole structures 161 to 164 may connect the front conductive paths (121 to 123) and back conductive paths (141 and 142), so as to form a continuous conductive path. In the embodiment, the direction of the electromagnetic flux generated by the continuous conductive path may be parallel to the front surface 101 of the substrate 10. In other words, the direction of the electromagnetic flux generated by the three-dimensional inductor structure L1 may be parallel to the front surface 101 of the substrate 10. In the embodiment, the front conductive paths 121 to 123 may substantially be bar-shaped. In some embodiments, the front conductive paths 121 to 123 may substantially be curved-shaped, such as an arc shape. In some embodiments, the direction of the electromagnetic flux generated by the three-dimensional inductor structure L1 may be perpendicular to the front surface 101 of the substrate 10.

In some embodiments, the front conductive path 121 may be electrically connected to the through-hole structure 161, the back conductive path 141 may be electrically connected between the through-hole structure 161 and the through-hole structure 162, the front conductive path 122 may be electrically connected between the through-hole structure 162 and the through-hole structure 163, the back conductive path 142 may be electrically connected between the through-hole structure 163 and the through-hole structure 164, and the front conductive path 123 may be electrically connected to the through-hole structure 164. As shown in FIG. 1, one end of the front conductive path 121 may be aligned with one end of the back conductive path 141, the other end of the back conductive path 141 may be aligned with one end of the front conductive path 122, and the other end of the front conductive path 122 may be aligned with one end of the back conductive path 142, and the other end of the back conductive path 142 may be aligned with one end of the front conductive path 123.

In some embodiments, the through-hole structure 161 may be electrically connected to the front conductive path 121 and the back conductive path 141, and may include a first end 1611 electrically connected to the front conductive path 121 and a second end 1612 electrically connected to the back conductive path 141. Similarly, the through-hole structure 162 may include a first end 1621 electrically connected to the front conductive path 122 and a second end 1622 electrically connected to the back conductive path 141. The through-hole structure 163 may include a first end 1631 electrically connected to the front conductive path 122 and a second end 1632 electrically connected to the back conductive path 142. The through-hole structure 164 may include a first end 1641 electrically connected to the front conductive path 123 and a second end 1642 electrically connected to the back conductive path 142.

In some embodiments, the front conductive stack 12 may further include connection portions 124 and 125 for connecting to other circuits or external circuits. The front conductive path 121 may be electrically connected between the connection portion 124 and the through-hole structure 161. The front conductive path 123 may be electrically connected between the through-hole structure 164 and the connection portion 125. In some embodiments, the semiconductor device 1 may further include an active circuit disposed on the front surface 101 of the substrate 10, and the connection portion 124 or the connection portion 125 may be coupled to the active circuit. For example, the active circuit may include an amplifier circuit, a low-noise amplifier circuit, and a switch. In some embodiments, the back conductive layer 14 may further include a back pattern 143, and for example, the back pattern 143 may include a ground line or a ground plane.

In some embodiments, the front conductive path 121 may include a first portion coupled to the connection portion 124, a second portion in contact with the first end 1611 of the through-hole structure 161, and a third portion extending between the first portion and the second portion. Similarly, the front conductive path 122 may include a first portion in contact with the first end 1621 of the through-hole structure 162, a second portion in contact with the first end 1631 of the through-hole structure 163, and a third portion extending between the first portion and the second portion. The front conductive path 123 may include a first portion in contact with the first end 1641 of the through-hole structure 164, a second portion coupled to the connection portion 125, and a third portion extending between the first portion and the second portion.

While FIG. 1 shows that the three-dimensional inductor structure L1 includes the front conductive paths 121 to 123, the back conductive paths 141 and 142, and the through-hole structures 161 to 164, those skilled in the art would recognize that the three-dimensional inductor structure may also include other numbers or shapes of front conductive paths, back conductive paths, and/or through-hole structures.

Figure 2:
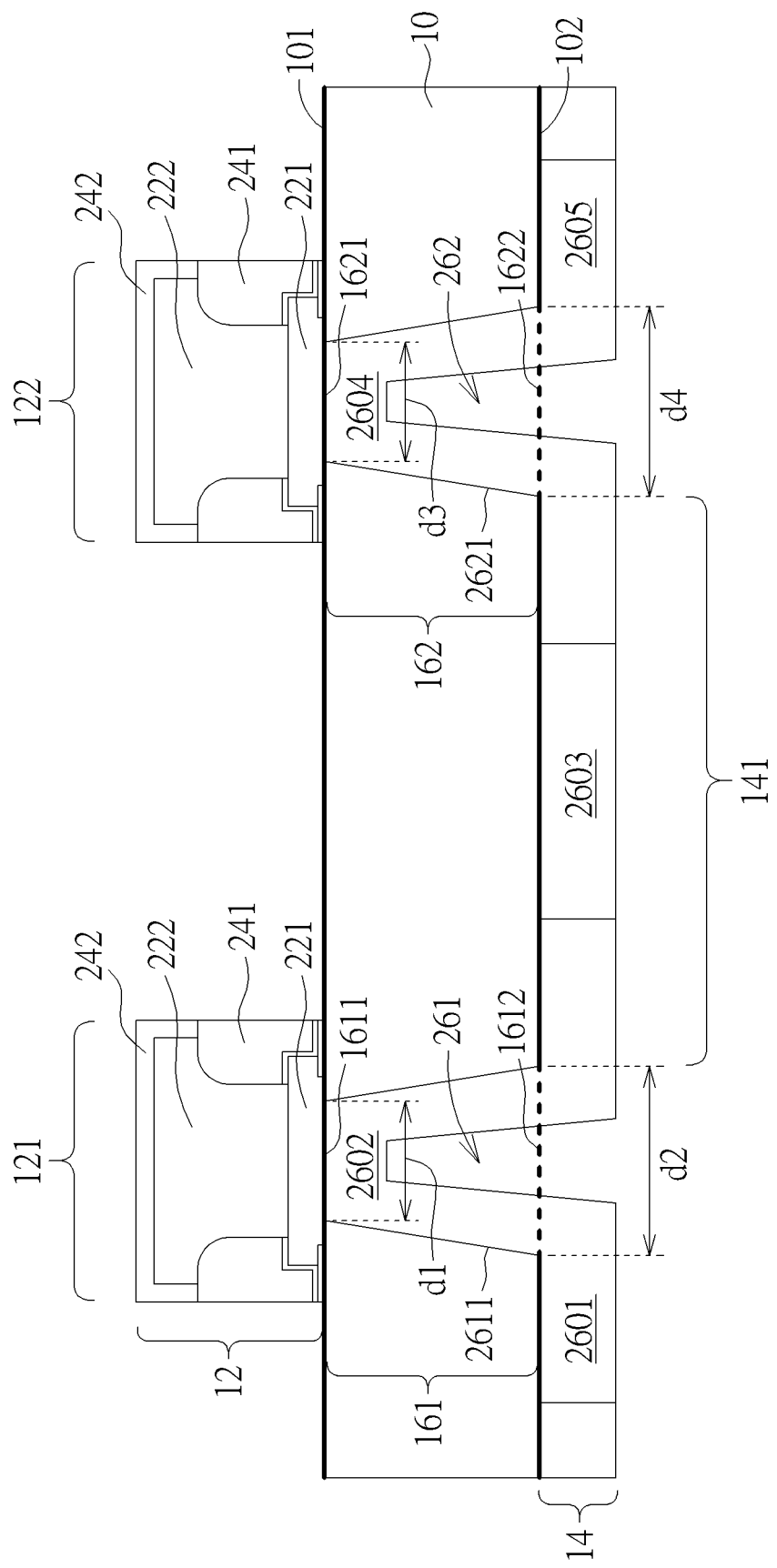
FIG. 2 is a cross section view of the semiconductor device in FIG. 1 along the line 2-2'.

FIG. 2 is a cross-sectional view of the semiconductor device 1 along the line 2-2' according to an embodiment of the invention. In FIG. 2, at least a portion of the front surface conductive stack 12 may include a plurality of conductive layers, and the plurality of conductive layers may be disposed along a direction perpendicular to the front surface 101 of the substrate 10. For example, at the front surface of the semiconductor substrate 10, the front conductive stack 12, which is configured to form the front conductive path 121 or 122, may include conductive layers 221 and 222 (also referred to as the first conductive layer 221 and the second conductive layer 222). In some embodiments, the front conductive stack 12, which is configured to form the connection portion 124 or 125 (also referred to as the first connection portion 124 and the second connection portion 125), may also include conductive layers 221 and 222. The conductive layer 221 may be disposed on the front surface 101 of the substrate 10, and the conductive layer 222 may be disposed on the conductive layer 221. In some embodiments, the conductive layers 221 and 222 may include various metal materials. For example, the conductive layers 221 or 222 may include any one of gold, silver, copper, aluminum and combination thereof. Further, the conductive layers 221 and 222 may include the same or different main metal materials, for example, the conductive layer 221 may mostly include gold, and the conductive layer 222 may mostly include copper. Furthermore, the conductive layers 221 and 222 may be covered with front protection layers 241 and 242 respectively. For example, the front protection layer 241 or 242 may substantially include nitride or polymide.

In some embodiments, an increased total thickness of the front conductive stack 12 and/or an increased total thickness of the back conductive layer 14 may improve the inductance quality factor of the three-dimensional inductance structure L1 and may enhance inductance characteristics with a reduction in manufacturing cost. For example, the thickness of the substrate 10 may be approximately 100 micrometers (m), the thickness of the conductive layer 221 may range approximately from 1 μm to 5 μm, and the thickness of the conductive layer 222 may range approximately from 30 μm to 400 μm. In other embodiments, the ratio of the thickness of the conductive layer 222 to the thickness of the conductive layer 221 may be between about 6 and 80. In an embodiment, the thickness of the conductive layer 222 may range approximately from 30 μm to 200 μm. For example, the thickness of the conductive layer 222 may be approximately 100 μm, the thickness of the conductive layer 221 may be approximately 5 μm, and the ratio of the thickness of the conductive layer 222 to the thickness of the conductive layer 221 may be approximately 20. In other embodiments, the thickness of the conductive layer 222 may range approximately from 30 μm to 60 μm. For example, the thickness of the conductive layer 222 may be approximately 50 μm, the thickness of the conductive layer 221 may be approximately 5 am, and thus the ratio of the thickness of the conductive layer 222 to the thickness of the conductive layer 221 may be approximately 10. In some embodiments, the conductive layer 222 may be formed, but is not limited to, by electroplating, and other suitable methods may also be used to form the conductive layer 222 of the thickness as described herein.

In FIG. 2, the thickness of the back conductive layer 14 may be less than 20 μm. For example, the thickness of the back conductive layer 14 may be 10 μm. While the back conductive layer 14 is shown as a single layer, this is only shown as an example. In some embodiments, the back conductive layer 14 is not limited to a single layer, that is, similar to the front conductive stack 12, at least a portion of the back conductive layer 14 may include a plurality of conductive sub-layers, and explanation therefor will be omitted here for brevity. Referring to FIG. 2, the back conductive layer 14 may include deposition portions 2601, 2603 and 2605, wherein the deposition portion 2603 may be used to form the back conductive path 141.

In some embodiments, the through-hole structure 161 may penetrate through the substrate 10 for connecting the front conductive stack 12 and the back conductive layer 14. In FIG. 2, the substrate 10 may include a through-hole, and the through-hole structure 161 is formed in the through-hole. For example, the through-hole structure 161 may include a deposition portion 2602 and a recess 261. The deposition portion 2602 may be formed on the top and sidewalls of the through-hole (referring to the directions shown in FIG. 2), and the recess 261 may be surrounded by the deposition portion 2602 on the sidewall. Similarly, the through-hole structure 162 may include a deposition portion 2604 and a recess 262. In one example, a through-hole of the substrate may include a wall surface 2611, and the deposition portion 2602 of the through-hole structure 161 may be conformably formed on the wall surface 2611 of the through-hole. Another through-hole of the substrate may have a wall surface 2621, and the deposition portion 2604 of the through-hole structure 162 may be conformably formed on the wall surface 2621 of the through-hole.

In some embodiments, the through-hole corresponding to the through-hole structure 161 may have a substantially conical cross-section, so that the through-hole structure 161 also has a substantially conical cross-section. For example, the through-hole structure 161 may have a first end 1611 and a second end 1612, and the deposition portion 2602 may be formed in the through-hole. In the embodiment in FIG. 2, the first end 1611 may be an upper end, and the second end 1612 may be a lower end. In some embodiments, the first end 1611 may have a diameter d1, and the second end 1612 may have a diameter d2. As shown in FIG. 2, the diameter d1 may be less than the diameter d2. In other words, the upper end of the through-hole structure 161 may be narrower than the lower end. In some embodiments, the diameter d1 may be approximately 35 μm and the diameter d2 may be approximately 70 μm. At the first end 1611, the deposition portion 2602 of the through-hole structure 161 may have a first surface in contact with the front conductive stack 12 (e.g., the conductive layer 221 of the front conductive stack 12). At the second end 1612, the deposition portion 2602 of the through-hole structure 161 may be in contact with the back conductive layer 14 (e.g., the deposition portions 2601 and 2603 of the back conductive layer 14). Similarly, the through-hole structure 162 may also have a substantially conical cross section with a first end 1621 and a second end 1622. The deposition portion 2604 of the through-hole structure 162 may be formed in a through-hole. The first end 1621 may have a diameter d3, the second end 1622 may have a diameter d4, and the diameter d3 may be less than the diameter d4. At the first end 1621, the deposition portion 2604 of the through-hole structure 162 may be in contact with the front conductive stack 12. At the second end 1622, the deposition portion 2604 of the through-hole structure 162 may be in contact with the back conductive layer 14. In some embodiments, the diameter d3 may be equal to or different from diameter d1, and/or the diameter d4 may be equal to or different from the diameter d2. For example, the diameter d3 may be approximately 35 μm, and the diameter d4 may be approximately 70 μm.

In some embodiments, the deposition portions 2601, 2603, and 2605 of the back conductive layer 14, the deposition portion 2602 of the through-hole structure 161, and the deposition portion 2604 of the through-hole structure 162 may be formed in a single process. For example, the deposition portions 2601 to 2605 may include a deposition layer of a single metal material, e.g., any one of gold, silver, copper, aluminum, and combinations thereof. In some examples, they may be formed of gold entirely. Further, any one of the deposition portions 2601 to 2605 may include a multilayer stack, and in the multilayer stack, the thickness of each layer may be equal to or different from that of the other layers, and the main metal material of each layer may be the same or different from other layers. For example, the total thickness of the multilayer stack may be less than 20 μm, e.g., approximately 10 μm.

In the embodiment, the three-dimensional inductor structure L1 may include the front conductive stack 12, the back conductive layer 14 and the through-hole structures 161 to 164. Compared to a conventional planar inductor structure, the three-dimensional inductor structure L1 of the present disclosure may need to a smaller area on the surface of the semiconductor device 1 to achieve the same inductance value, resulting in a reduction in the circuit area. Further, the front conductive stack 12, the back conductive layer 14, and/or the through-hole structures 161 to 164 of the three-dimensional inductor structure L1 may include a multilayer stack to effectively reduce eddy currents and to enhance the quality factor of the inductor. Furthermore, the front conductive stack 12 may include conductive layers 221 and 222, and the thicker the conductive layer 221 and/or conductive layer 222 is, the more favorable the quality factor of the inductor may be.

Figure 3:
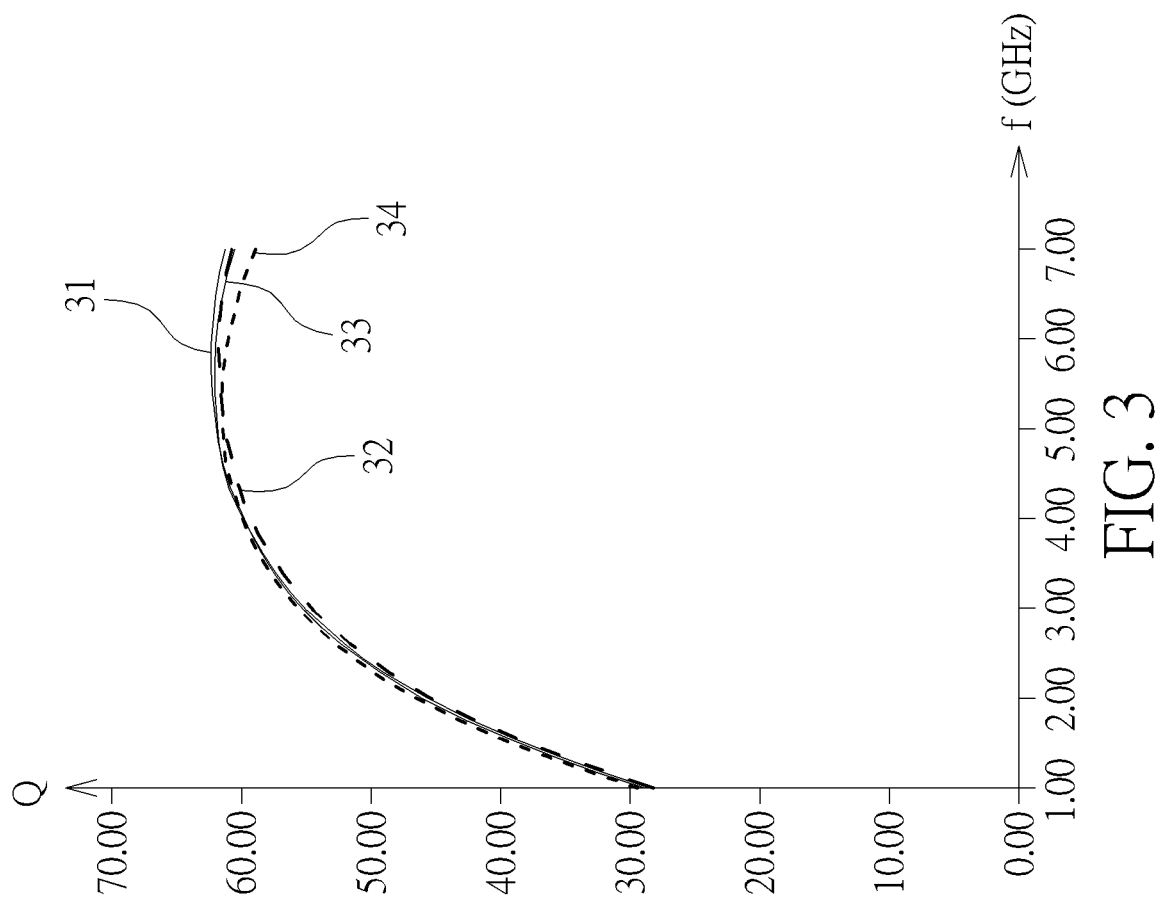
FIG. 3 shows the frequency response of a three-dimensional inductor structure.

FIG. 3 shows the frequency response of the three-dimensional inductor structure, with the conductive layers 222 of the front conductive stack 12 having different thicknesses. The horizontal axis represents the frequency f in gigahertz (GHz), such as 6 GHz, and the vertical axis represents the quality factor Q. The curve 31 represents the frequency response of a first three-dimensional inductor structure with a thickness of the conductive layer 222 being approximately 100 μm. The curve 32 represents the frequency response of a second three-dimensional inductor structure with a thickness of the conductive layer 222 being approximately 50 μm. The curve 33 represents the frequency response of a third three-dimensional inductor structure with a thickness of the conductive layer 222 being approximately 200 μm. The curve 34 represents the frequency response of a fourth three-dimensional inductor structure with a thickness of the conductive layer 222 being approximately 400 μm. As shown in FIG. 3, in the frequency band between 1 GHz and 5 GHz, the quality factors Q shown by the curves 31 to 34 are similar, and the quality factors Q increase gradually with the increase of frequency. In the frequency band from 5 GHz to 6 GHz, the curves 31 to 34 all reach the maximums thereof, and further, at 6 GHz, the quality factor Q of the curve 31 is larger than the other lines.

Figure 4:
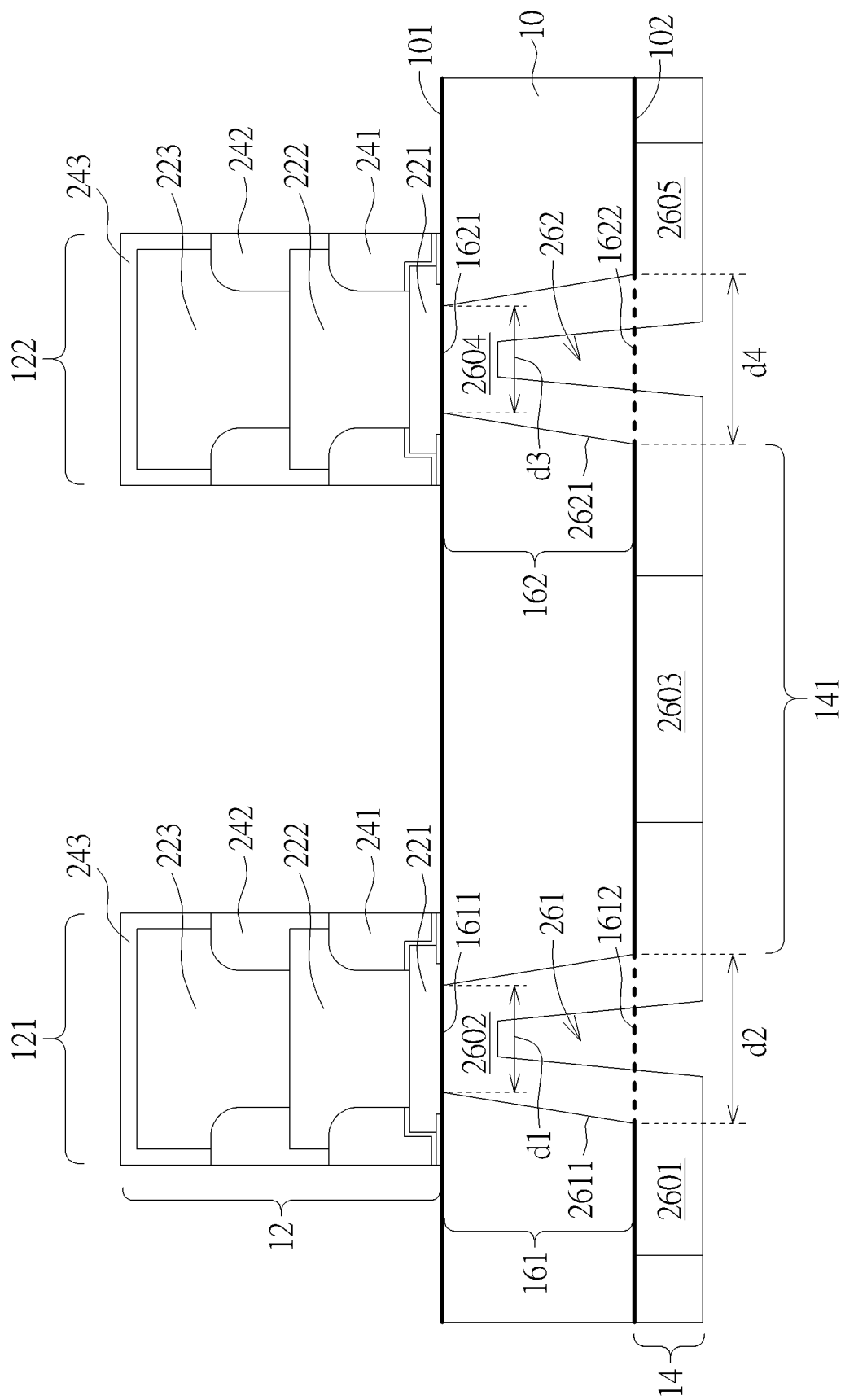
FIG. 4 is a cross section view of the semiconductor device in FIG. 1 along the line 2-2' according to another embodiment of the invention.

FIG. 4 is a cross-sectional view of the semiconductor device 1 along the line 2-2' according to another embodiment of the invention. The difference between the embodiments in FIG. 4 and FIG. 2 lies in that the front conductive stack 12 in FIG. 4 may further include a conductive layer 223 (also referred to as a third conductive layer 223). The conductive layer 223 may be disposed on the conductive layer 222, and the conductive layer 223 may be covered with a front protection layer 243. In some embodiments, the front protection layer 243 may include nitride and polyimide. In some embodiments, the front conductive stack 12 configured to form the connection portion 124 or 125 may further include a conductive layer 223. The conductive layer 223 may include any one of gold, silver, copper, aluminum and combination thereof. The material of the conductive layer 223 may be the same or different from that of the conductive layers 221 and/or 222. For example, the conductive layer 221 may be primarily formed of gold, the conductive layer 222 may be primarily formed of copper, and the conductive layer 223 may be primarily formed of gold. In some embodiments, the thickness of the conductive layer 223 may range from 1 μm to 5 μm, the thickness of the conductive layer 223 may be equal to the thickness of the conductive layer 221, and the thickness of the conductive layer 223 may be less than the thickness of the conductive layer 222. For example, the thickness of the conductive layer 221 may be approximately 5 μm, the thickness of the conductive layer 222 may be approximately 50 am, and the thickness of the conductive layer 223 may be approximately 5 μm. In such a case, the ratio of the thickness of the conductive layer 222 to the thickness of the conductive layer 223 is about 10. Other structures and configurations of the embodiment in FIG. 4 are similar to those in FIG. 2, and the explanations therefor will not be repeated here for brevity.

While FIGS. 2 and 4 only show that the front conductive stack 12 may include 2 or 3 conductive layers, those skilled in the art may modify the number of layers in the front conductive stack 12 to more than 3 based on the principle of the present invention.

Figure 5A:
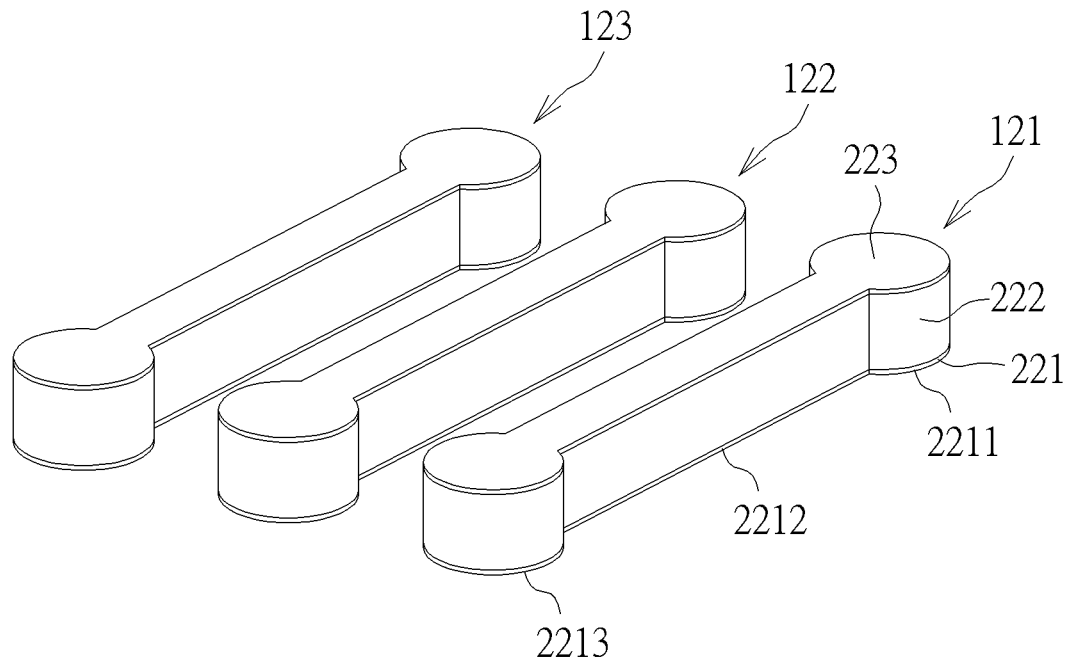
FIG. 5A shows the front conductive stack having a continuous structure for the conductive paths of the semiconductor device 1 of FIG. 1.
Figure 5B:
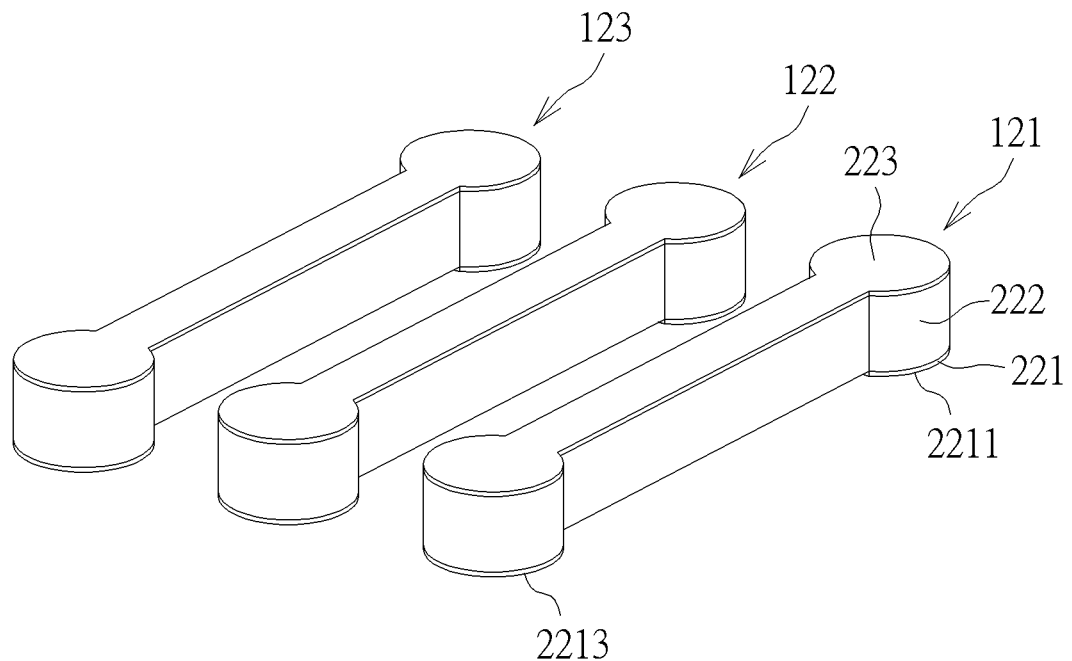
FIG. 5B shows the front conductive stack having a discontinuous structure for the conductive paths of the semiconductor device 1 of FIG. 1.

In some embodiments, on the front surface 101 of the substrate 10, the front conductive stack 12 forming the front conductive paths 121 to 123 may include a continuous structure or a discontinuous structure. FIG. 5A shows the front conductive stack 12 being a continuous structure as for the conductive paths 121 to 123 of the semiconductor device 1. FIG. 5B shows the front conductive stack 12 being a discontinuous structure as for the conductive paths 121 to 123 of the semiconductor device 1. In detail, in FIG. 5A, with respect to the front conductive path 121, the front conductive stack 12 may include the conductive layers 221, 222, and 223, and the conductive layer 221 may include continuous conductive portions 2211 to 2213. In FIG. 5B, with respect to the front conductive path 121, the conductive layer 221 of the front conductive stack 12 may include discontinuous conductive portions 2211 and 2213. In other embodiments, similar to the conductive layer 221 in FIG. 5B, the conductive layers 222 and/or 223 may also include discontinuous structures.

Figure 6:
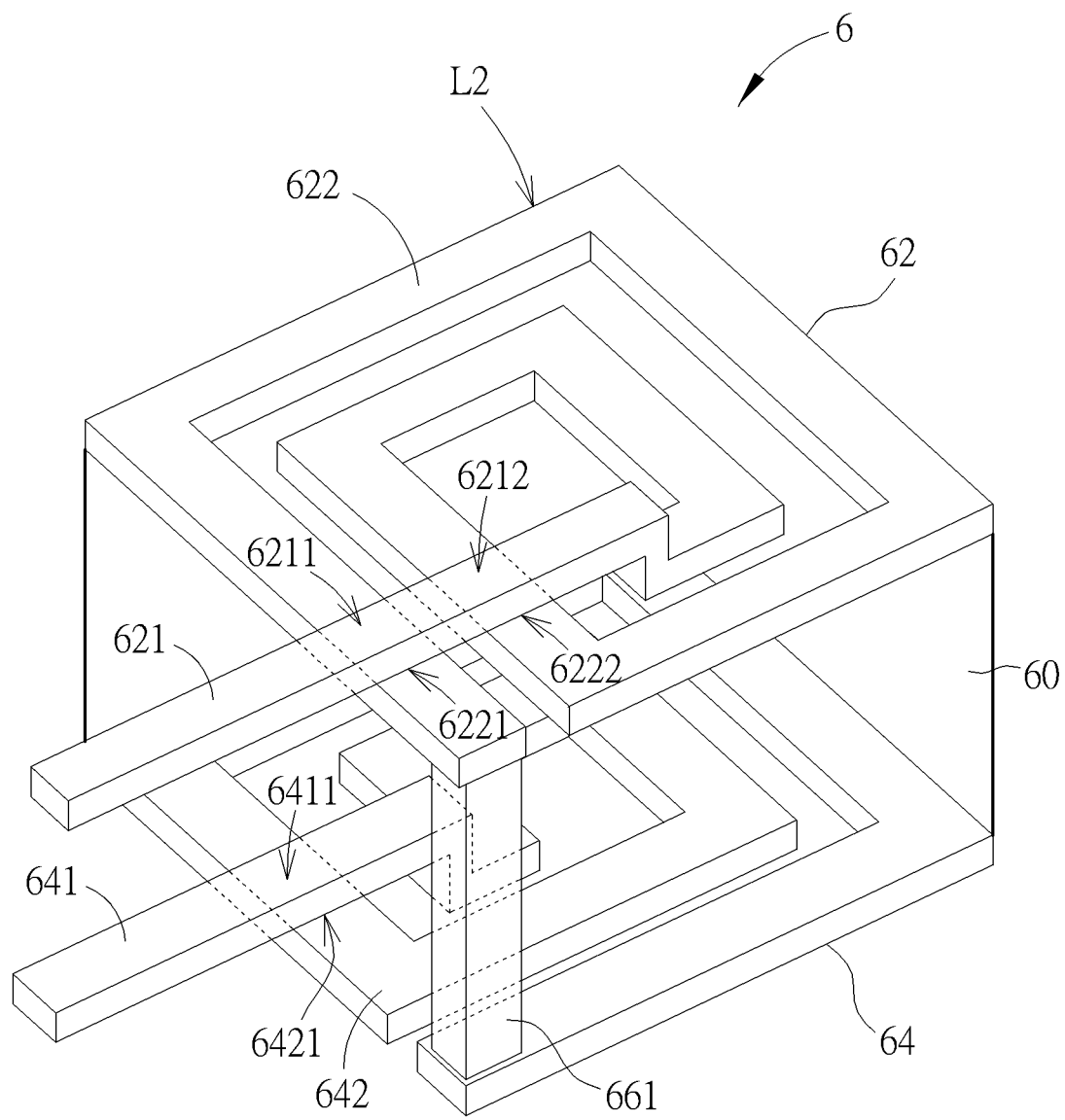
FIG. 6 is a schematic diagram of a semiconductor device according to another embodiment of the invention.

FIG. 6 is a schematic diagram of a semiconductor device 6 according to another embodiment of the invention. The semiconductor device 6 may include a substrate 60 and a three-dimensional inductor structure L2. The three-dimensional inductor structure L2 may include a front conductive stack 62, a back conductive layer 64 and a through-hole structure 661. The substrate 60 may include a front surface and a back surface. The front conductive stack 62 may be disposed on the front surface of the substrate 60, and the back conductive layer 64 may be disposed on the back surface of the substrate 60. The through-hole structure 661 may penetrate from/to the front surface to/from the back surface of the substrate 60, and electrically connect the front conductive stack 62 to the back conductive layer 64. As shown in FIG. 6, the front conductive stack 62 may include an input conductive path 621 and a front conductive path 622 electrically connected to each other. The front conductive path 622 may have a first spiral shape. The input conductive path 621 may be bar-shaped, and the portions 6211 and 6212 of the input conductive path 621 may respectively bridge over the portions 6221 and 6222 of the front conductive path 622. The back conductive layer 64 may include an output conductive path 641 and a back conductive path 642 electrically connected to each other. The back conductive path 642 may have a second spiral shape. The output conductive paths 641 may be bar-shaped. The portion 6411 of output conductive path 641 may bridge over the portion 6421 of back conductive path 642. The through-hole structure 661 may be electrically connected between the front conductive path 622 and the back conductive path 642. The direction of the electromagnetic flux generated by the three-dimensional inductor structure L2 may be perpendicular to the front surface of the substrate 60. In some embodiments, by increasing the thickness of the front conductive stack 12 and/or the thickness of the back conductive layer 14, the quality factor and the inductance characteristics of the three-dimensional inductance structure L2 may be enhanced, and the manufacturing cost may also be reduced. The structure of the through-hole structure 661 may be similar to one of the through-hole structures 161 to 164 in the semiconductor device 1, the explanation therefor will not be repeated here for brevity.

In the embodiment, the three-dimensional inductor structure L2 may include the front conductive stack 62, the back conductive layer 64 and the through-hole structure 661. Compared to a conventional planar inductor structure, the three-dimensional inductor structure L2 may need a smaller circuit area to achieve the same inductance, and the quality factor may be improved significantly.

Figure 7:
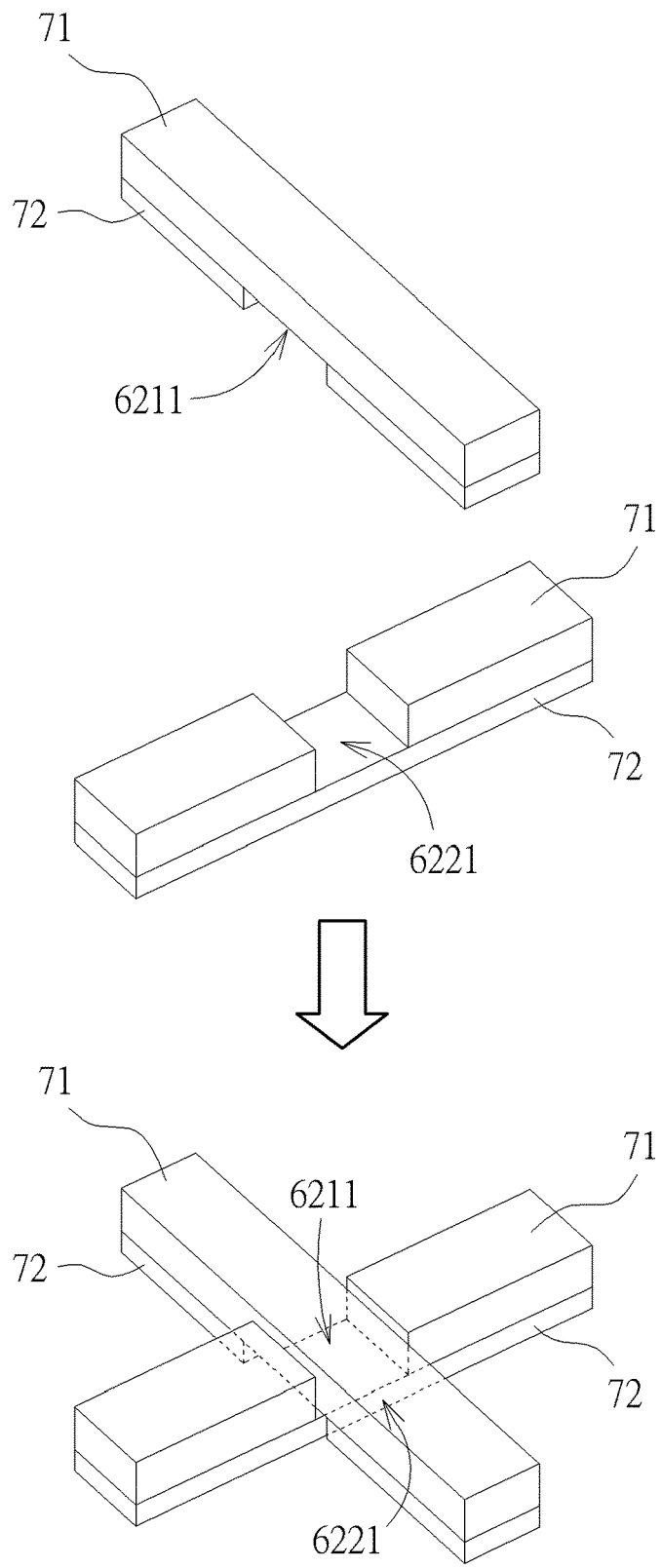
FIG. 7 is a schematic diagram of a portion of the semiconductor device in FIG. 6.

FIG. 7 is a partial schematic diagram of the semiconductor device 6, showing a portion 6211 of the input conductive path 621 and a portion 6221 of the front conductive path 622. As shown in FIG. 7, the portion 6211 of the input conductive path 621 may span over the portion 6221 of the front conductive path 622. At the portion 6211, a conductive layer 71 (e.g., the first conductive layer) may be continuous, and a conductive layer 72 (e.g., the second conductive layer) may be discontinuous, and at portion 6221, the conductive layer 71 may be discontinuous, and the conductive layer 72 may be continuous. With the portion 6211 and the portion 6221 combined, an insulating layer may be provided at the crossover position there-between, so as to insulate the portion 6211 (corresponding to the input conductive path 621) and the portion 6221 (corresponding to the front conductive path 622) in the perpendicular direction. The arrangement of other conductive paths of the three-dimensional inductance structure L2 at the crossover position may be similar to the configuration shown in FIG. 7, and the explanation therefor will not be repeated here for brevity.

Figure 8:
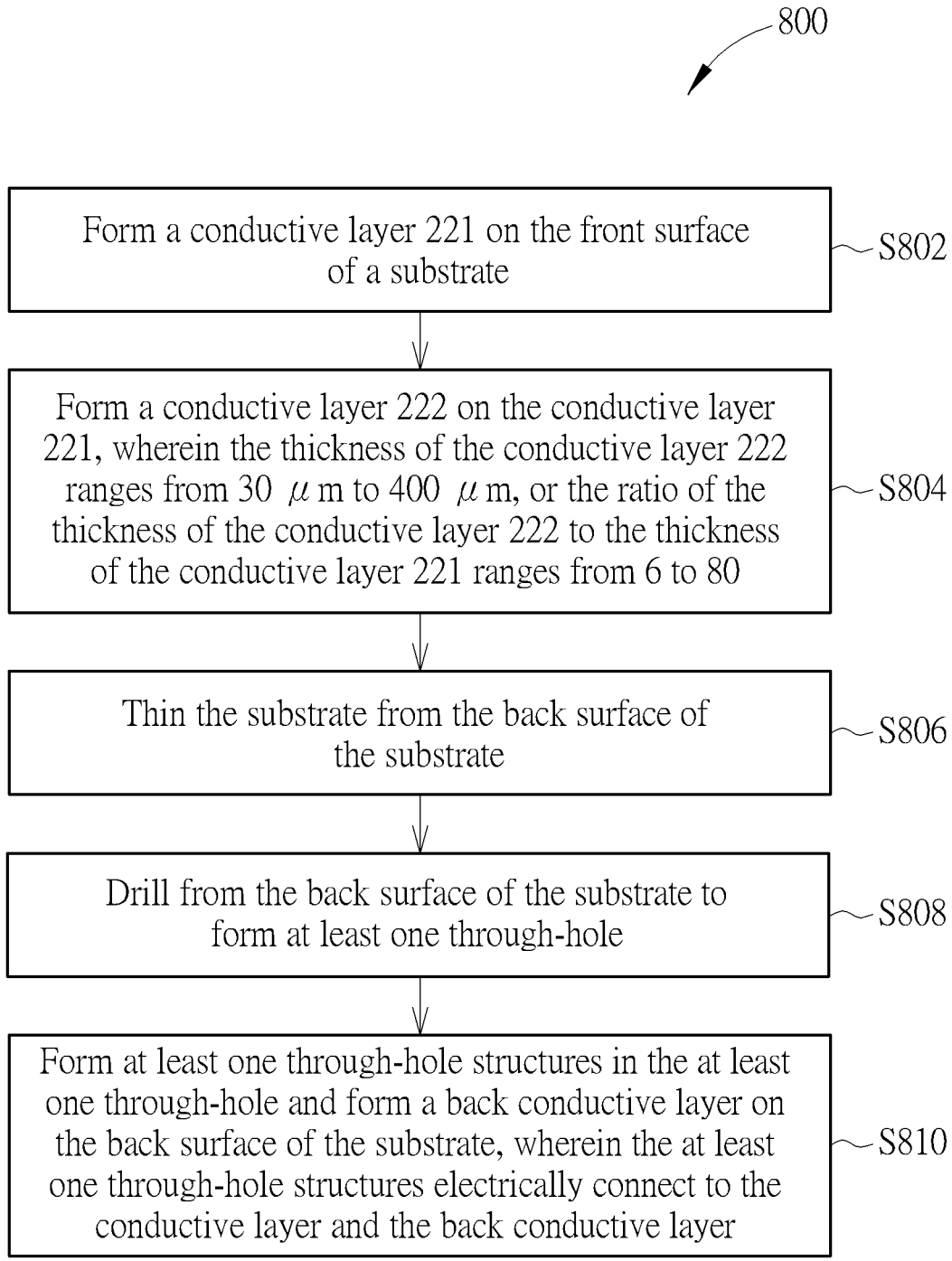
FIG. 8 is a flowchart of a method of forming the semiconductor device in FIG. 1 or FIG. 8.

FIG. 8 is a flowchart of a method 800 for forming the semiconductor device 1 or 6. Explanation will be provided hereinafter with reference to the semiconductor device 1. The method 800 may include Steps S802 to S810. Steps S802 and S804 are used to form the front conductive stack 12. Steps S806 to S810 are used to form the through-hole structures 161 to 164 and the back conductive layer 14. Any reasonable step change or adjustment is within the scope of the present disclosure. Steps S802 to S810 are detailed as follows:

Step S802: Form a conductive layer 221 on the front surface 101 of the substrate 10;

Step S804: Form a conductive layer 222 on the conductive layer 221, wherein the thickness of the conductive layer 222 ranges from 30 µm to 400 µm, or the ratio of the thickness of the conductive layer 222 to the thickness of the conductive layer 221 ranges from 6 to 80;

Step S806: Thin the substrate 10 from the back surface 102 of the substrate 10;

Step S808: Drill from the back surface of the substrate to form at least one through-hole;

Step S810: Form the through-hole structures 161 to 164 in at least one through-hole and a back conductive layer 14 on the back surface 102 of the substrate 10.

The method 800 is explained as follows with reference to the embodiments of FIGS. 1 and 4. In Step S802, the conductive layer 221 may be formed on the front surface 101 of the substrate 10, for example, by a sputtering process. In Step S804, the conductive layer 222 may be formed, for example, by an electroplating process. In some embodiments, the method 800 may continue to form the conductive layer 223 on the conductive layer 222 by a sputtering process. In the method 800, the front protective layers 241-243 may be formed on the front conductive layers 221-223, respectively. In Step S806, the substrate 10 is thinned to a predetermined thickness, where the substrate 10 is sufficiently thick to support the conductive layers 221 to 223 without being affected by stress, and sufficiently thin to be transparent for aligning the front conductive paths 121 to 123 observed from the back surface 102. The predetermined thickness may range from 75 µm to 150 µm, e.g., 100 µm. In Step S808, an infrared camera may be used to identify the ends of the front conductive paths 121 to 123 from the back surface 102 of the substrate 10, so as to determine the positions of the through-holes. Then, the substrate 10 may be drilled from the back surface 102 to form through-holes. In Step S810, referring to FIG. 2, since the substrate 10 are drilled from the back surface 102, the diameter d2 of the formed through-holes may be larger than the diameter d1, and the diameter d4 may be larger than the diameter d3. In some embodiments, after the through-holes are formed, a deposition process may be performed to form at least one deposited metal layer on the back surface of the substrate. The at least one deposited metal layer may be used to form portions of the through-hole structure 161, such as portion 2602. The at least one deposited metal layer may be further patterned to form the back conductive paths 141 and 142 of the back conductive layer 14. In other embodiments, after the through-holes are formed, an electroplating process may be performed to form at least one electroplated metal layer on the back surface of the substrate. The at least one electroplated metal layer may be used to form portions of the through-hole structure 161, such as portion 2602. The least one electroplated metal layer may be further patterned to form the back conductive paths 141 and 142 of the back conductive layer 14. For example, with the at least one deposited metal layer or the at least one electroplated metal layer formed, a dry etching or wet etching process may be performed to form the backside conductive paths 141 and 142 which may be aligned with the front conductive paths 121 to 123, as shown in FIG. 1.

The method 800 may be performed to form a three-dimensional inductor structure on a gallium arsenide substrate or a silicon substrate, and three-dimensional inductor structure may occupy a smaller area and have an enhanced quality factor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device comprising:
   a substrate comprising a front surface and a back surface; and
   a three-dimensional inductor structure comprising:
      a front conductive stack, at least a portion of the front conductive stack comprising:
         a first conductive layer disposed on the front surface of the substrate; and
         a second conductive layer disposed on the first conductive layer, a thickness of the second conductive layer ranging from 30 micrometers to 400 micrometers;
      a back conductive layer disposed on the back surface of the substrate; and
      at least one through-hole structure penetrating the substrate and electrically connecting the front conductive stack and the back conductive layer.

2. The semiconductor device of claim 1, wherein the thickness of the second conductive layer ranges from 30 micrometers to 200 micrometers.

3. The semiconductor device of claim 1, wherein the thickness of the second conductive layer ranges from 30 micrometers to 60 micrometers.

4. The semiconductor device of claim 1, wherein:
the at least one through-hole structure comprises a first through-hole structure and a second through-hole structure; and
the front conductive stack comprises a first conductive path, and the first conductive path is electrically connected between the first through-hole structure and the second through-hole structure.

5. The semiconductor device of claim 4, wherein:
the first through-hole structure comprises a first end electrically connected to the first conductive path, and a second end electrically connected to the back conductive layer; and
the second through-hole structure comprises a first end electrically connected to the first conductive path, and a second end electrically connected to the back conductive layer.

6. The semiconductor device of claim 5, wherein the first conductive path comprises:
a first portion in contact with the first end of the first through-hole structure;
a second portion in contact with the first end of the second through-hole structure; and
a third portion extends between the first portion and the second portion.

7. The semiconductor device of claim 5, wherein:
the first end of the first through-hole structure has a first diameter;
the second end of the first through-hole structure has a second diameter, the second diameter being greater than or equal to the first diameter;
the first end of the second through-hole structure has a third diameter; and
the second end of the second through-hole structure has a fourth diameter, the fourth diameter being greater than or equal to the third diameter.

8. The semiconductor device of claim 4, wherein:
the at least one through-hole structure further comprises a third through-hole structure; and
the front conductive stack comprises a second conductive path electrically connected between the third through-hole structure and a first connection portion.

9. The semiconductor device of claim 8, wherein the first conductive path and/or the second conductive path is bar-shaped.

10. The semiconductor device of claim 8, wherein the back conductive layer comprises a first back conductive path electrically connected between the second through-hole structure and the third through-hole structure.

11. The semiconductor device of claim 4, wherein a direction of an electromagnetic flux generated by the three-dimensional inductor structure is parallel to the front surface of the substrate.

12. The semiconductor device of claim 1, wherein the front conductive stack presents a first spiral shape and the back conductive layer presents a second spiral shape.

13. The semiconductor device of claim 12, wherein a direction of an electromagnetic flux generated by the three-dimensional inductor structure is perpendicular to the front surface of the substrate.

14. The semiconductor device of claim 1, wherein the front conductive stack further comprises a third conductive layer disposed on the second conductive layer.

15. The semiconductor device of claim 14, wherein the first conductive layer, the second conductive layer and the third conductive layer comprise any one of gold, silver, copper, aluminum and a combination thereof.

16. The semiconductor device of claim 1, wherein the second conductive layer is fabricated by an electroplating process.

17. The semiconductor device of claim 14, further comprising a conductive protrusion comprising:
a fourth conductive layer disposed on the front surface of the substrate; and
a fifth conductive layer disposed on the fourth conductive layer, a thickness of the fourth conductive layer ranging from 30 micrometers to 400 micrometers; and
a sixth conductive layer disposed on the fifth conductive layer.

18. The semiconductor device of claim 14, wherein a thickness of the first conductive layer ranges from 1 micrometer to 5 micrometers.

19. A semiconductor device comprising:
a substrate comprising a front surface and a back surface;
a three-dimensional inductor structure comprising:
a front conductive stack, at least a portion of the front conductive stack comprising:
a first conductive layer disposed on the front surface of the substrate; and
a second conductive layer disposed on the first conductive layer, a ratio of a thickness of the second conductive layer to a thickness of the first conductive layer ranging from 6 to 80;
a back conductive layer disposed on the back surface of the substrate; and
at least one through-hole structure penetrating the substrate and electrically connecting the front conductive stack and the back conductive layer.

20. A method of forming a three-dimensional inductor structure, the method comprising:
forming a first conductive layer on a front surface of a substrate;
forming a second conductive layer on the first conductive layer, a thickness of the second conductive layer ranging from 30 micrometers to 400 micrometers, or a ratio of the thickness of the second conductive layer to a thickness of the first conductive layer ranging from 6 to 80;
thinning the substrate from a back surface of the substrate;
drilling from the back surface of the substrate to form at least one through-hole;
forming at least one through-hole structure in the at least one through-hole, the at least one through-hole structure being electrically connected to the front conductive layer; and
forming a back conductive layer on the back surface of the substrate, the at least one through-hole structure being electrically connected to the back conductive layer.

* * * * *